(12) United States Patent
Choi et al.

(10) Patent No.: US 11,521,684 B2
(45) Date of Patent: Dec. 6, 2022

(54) MEMORY DEVICE AND METHOD OF OPERATING THE SAME

(71) Applicant: SK hynix Inc., Icheon-si Gyeonggi-do (KR)

(72) Inventors: Gil Bok Choi, Icheon-si Gyeonggi-do (KR); Dae Hwan Yun, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/308,583

(22) Filed: May 5, 2021

(65) Prior Publication Data

US 2022/0172780 A1    Jun. 2, 2022

(30) Foreign Application Priority Data

Dec. 2, 2020    (KR) .................. 10-2020-0166854

(51) Int. Cl.
| | |
|---|---|
| *G11C 7/00* | (2006.01) |
| *G11C 16/08* | (2006.01) |
| *G11C 16/04* | (2006.01) |
| *G11C 11/56* | (2006.01) |
| *G11C 16/32* | (2006.01) |
| *G11C 16/26* | (2006.01) |

(52) U.S. Cl.
CPC .......... *G11C 16/08* (2013.01); *G11C 11/5671* (2013.01); *G11C 16/0483* (2013.01); *G11C 16/26* (2013.01); *G11C 16/32* (2013.01)

(58) Field of Classification Search
CPC ....... G11C 7/1051; G11C 7/22; G11C 7/1072; G11C 7/1006; G11C 7/1066
USPC ................. 365/189.14, 189.15, 204
See application file for complete search history.

(56) References Cited

U.S. PATENT DOCUMENTS

2015/0318045 A1*  11/2015  Yun .................. G11C 16/30
                                                       365/185.25
2016/0260489 A1*   9/2016  Lee ................. G11C 16/3427

FOREIGN PATENT DOCUMENTS

KR     1020100022226 A    3/2010
KR        101047576 B1    7/2011

\* cited by examiner

*Primary Examiner* — Son T Dinh
(74) *Attorney, Agent, or Firm* — William Park & Associates Ltd.

(57) ABSTRACT

A memory device, and a method of operating the same, includes a memory cell array coupled to a plurality of word lines, wherein each word line is coupled to a plurality of memory cells. The memory device also includes a peripheral circuit configured to perform a sensing operation of sensing selected memory cells coupled to a selected word line selected from among the plurality of word lines. The memory device further includes control logic configured to control the peripheral circuit apply a turn-on voltage to a block word line coupled to the selected word line when the sensing operation is terminated and when potentials of the plurality of word lines are increased due to a recovery operation for channels of the plurality of memory cells after the plurality of word lines have been discharged.

20 Claims, 14 Drawing Sheets

ND METHOD OF
MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0166854, filed on Dec. 2, 2020, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

A storage device is a device which stores data under the control of a host device such as a computer, a smartphone, or a smartpad. Examples of a storage device include a device such as a hard disk drive (HDD) which stores data in a magnetic disk, and a device such as a solid state drive (SSD) or a memory card which stores data in a semiconductor memory, particularly, a nonvolatile memory, according to the device in which data is stored.

A storage device may include a memory device in which data is stored and a memory controller which controls the storage of data in the memory device. Such memory devices may be classified as a volatile memory or a nonvolatile memory. Representative examples of a nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory device that controls a voltage level applied to a block word line so as to reduce a potential difference between word lines and a channel occurring after a word line discharge operation has been performed during a sensing operation, and a method of operating the memory device.

In accordance with an embodiment of the present disclosure is a memory device including a memory cell array coupled to a plurality of word lines, wherein each word line is coupled to a plurality of memory cells, a peripheral circuit configured to perform a sensing operation of sensing selected memory cells coupled to a selected word line selected from among the plurality of word lines and control logic configured to control the peripheral circuit to apply a turn-on voltage to a block word line coupled to the selected word line when the sensing operation is terminated and when potentials of the plurality of word lines are increased due to a recovery operation for channels of the plurality of memory cells after the plurality of word lines have been discharged.

In accordance with an embodiment of the present disclosure is a memory device including a memory cell array coupled to a plurality of word lines, wherein each word line is coupled to a plurality of memory cells, a peripheral circuit configured to perform a sensing operation of sensing selected memory cells coupled to a selected word line selected from among the plurality of word lines, an idle state sensor configured to determine whether the memory device is in an idle state in which no operation is being performed on the memory cell array and to generate status information, a voltage controller configured to generate voltage information used to set a voltage level to apply to a block word line coupled to the selected word line and an operation signal generator configured to, when the sensing operation is terminated and when potentials of the plurality of word lines are increased due to a recovery operation for channels of the plurality of memory cells after the plurality of word lines have been discharged, generate an operation signal instructing a turn-on voltage to be applied to the block word line based on the status information and the voltage information.

In accordance with an embodiment of the present disclosure is a method of operating a memory device including a memory cell array coupled to a plurality of word lines, wherein each word line is coupled to a plurality of memory cells, the method comprising, performing a sensing operation of sensing selected memory cells coupled to a selected word line selected from among the plurality of word lines, discharging the plurality of word lines after the sensing operation has been performed, performing a recovery operation on channels of the plurality of memory cells, determining whether the memory device is in an idle state during which no operation is being performed on the plurality of memory cells after the recovery operation has been performed, and applying a turn-on voltage to a block word line coupled to the selected word line in the idle state.

DETAILED DESCRIPTION

Specific structural or functional descriptions for presented embodiments of the present are only for description of the embodiments. The descriptions should not be construed as being limiting or globally applicable to other embodiments consistent with the teachings of the present specification or application.

Various embodiments of the present disclosure are described more fully hereinafter with reference to the accompanying drawings, in which embodiments of the present disclosure are illustrated, so that those of ordinary skill in the art can easily carry out the technical idea of the present disclosure.

Figure 1:
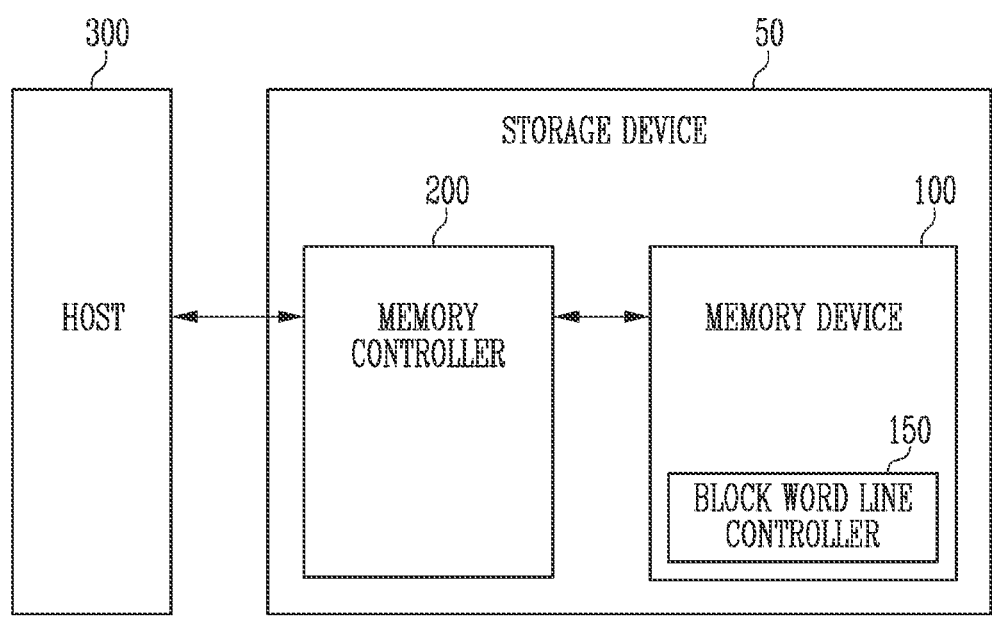
FIG. 1 is a block diagram illustrating a storage device.

FIG. 1 is a block diagram illustrating a storage device.

Referring to FIG. 1, a storage device 50 may include memory device 100 and a memory controller 200.

The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change random access memory (PRAM), a magnetoresistive RAM (MRAM), a ferroelectric RAM (FRAM), or a spin transfer torque RAM (STT-RAM). In the present specification, for convenience of description, a description is made on the assumption that the memory device 100 is a NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The teachings of the present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation, or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a block word line controller 150. The block word line controller 150 may control a turn-on operation and a turn-off operation of transistors coupled to a block word line during a sensing operation. The sensing operation may be either a read operation or a verify operation included in a program loop.

In detail, when the memory device 100 performs a sensing operation, a sensing voltage may be applied to a selected word line, and a pass voltage may be applied to unselected word lines. The sensing operation may be performed by applying the sensing voltage to the selected word line and applying the pass voltage to the unselected word lines.

Thereafter, the potential of the selected word line may increase to a pass voltage level. When the potential of the selected word line increases to the pass voltage level, all word lines may be simultaneously discharged. This operation is referred to as an equalizing operation.

However, after the equalizing operation has been performed, all word lines are simultaneously discharged, and thus the channel potentials of the memory cells may be simultaneously decreased. That is, channel negative boosting may occur. When channel negative boosting occurs, the memory device 100 may perform a recovery operation corresponding to the channel negative boosting.

When a recovery operation corresponding to channel negative boosting is performed, the corresponding channel potential may increase. However, as the channel potential increases, the potentials of all word lines may also increase. Therefore, as the potentials of all word lines increase, threshold voltage distributions of memory cells in an erased state, which are coupled to the word lines, may be shifted. For example, the threshold voltage levels of memory cells in an erased state may increase.

In order to prevent the shifting of threshold voltage distributions of the memory cells, the block word line controller 150 included in the memory device 100 may control a voltage level to be applied to the block word line. Here, the block word line may be a line for coupling local word lines coupled to the memory block included in the memory device 100.

For example, when the memory device 100 is in an idle state or a ready state after the recovery operation corresponding to channel negative boosting has been completed, the block word line controller 150 may turn on the transistors coupled to the block word line. The idle state or ready state of the memory device 100 may be a state in which, after the corresponding operation has been completed, the memory device 100 is waiting for a subsequent operation to be performed, that is, a state in which no operation is performed.

Thereafter, when a preset time has elapsed, the block word line controller 150 may turn off the transistors coupled to the block word line. The preset time may be a period included in the time during which the memory device 100 is in an idle state. The preset time may be a reference time. The word "preset" as used herein with respect to a parameter, such as a preset time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In an embodiment, after the recovery operation corresponding to channel negative boosting has been performed, the transistors coupled to the block word line are turned on only for the preset time, thus enabling the potentials of all word lines to be decreased. Therefore, after an equalizing operation has been performed during a sensing operation, a channel potential and the potentials of word lines may be prevented from changing.

The memory controller 200 may control the overall operation of the storage device 50.

When a supply voltage is applied to the storage device 50, the memory controller 200 may run firmware. When the memory device 100 is a flash memory device 100, the memory controller 200 may run firmware such as a Flash Translation Layer (FTL) for controlling communication between the host 300 and the memory device 100.

In an embodiment, the memory controller 200 may include firmware (not illustrated) which may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in a buffer memory.

The memory controller 200 may control the memory device 100 so that a program operation, a read operation, or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 so as to perform background operations, such as a program operation for wear leveling and a program operation for garbage collection.

In an embodiment, the storage device 50 may include a buffer memory (not illustrated). The memory controller 200 may control the exchange of data between the host 300 and the buffer memory (not illustrated). Alternatively, the memory controller 200 may temporarily store system data for controlling the memory device 100 in the buffer memory. For example, the memory controller 200 may temporarily store data, input from the host 300, in the buffer memory, and may then transmit the data, temporarily stored in the buffer memory, to the memory device 100.

In various embodiments, the buffer memory may be used as a working memory or a cache memory for the memory controller 200. The buffer memory may store codes or commands that are executed by the memory controller 200. Alternatively, the buffer memory may store data that is processed by the memory controller 200.

In an embodiment, the buffer memory may be implemented as a DRAM such as a double data rate SDRAM (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the buffer memory may be coupled to the storage device 50 from outside the storage device 50. In this case, volatile memory devices coupled to the storage device 50 may function as the buffer memory.

In an embodiment, the memory controller 200 may control at least two memory devices. In this case, the memory controller 200 may control the memory devices depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
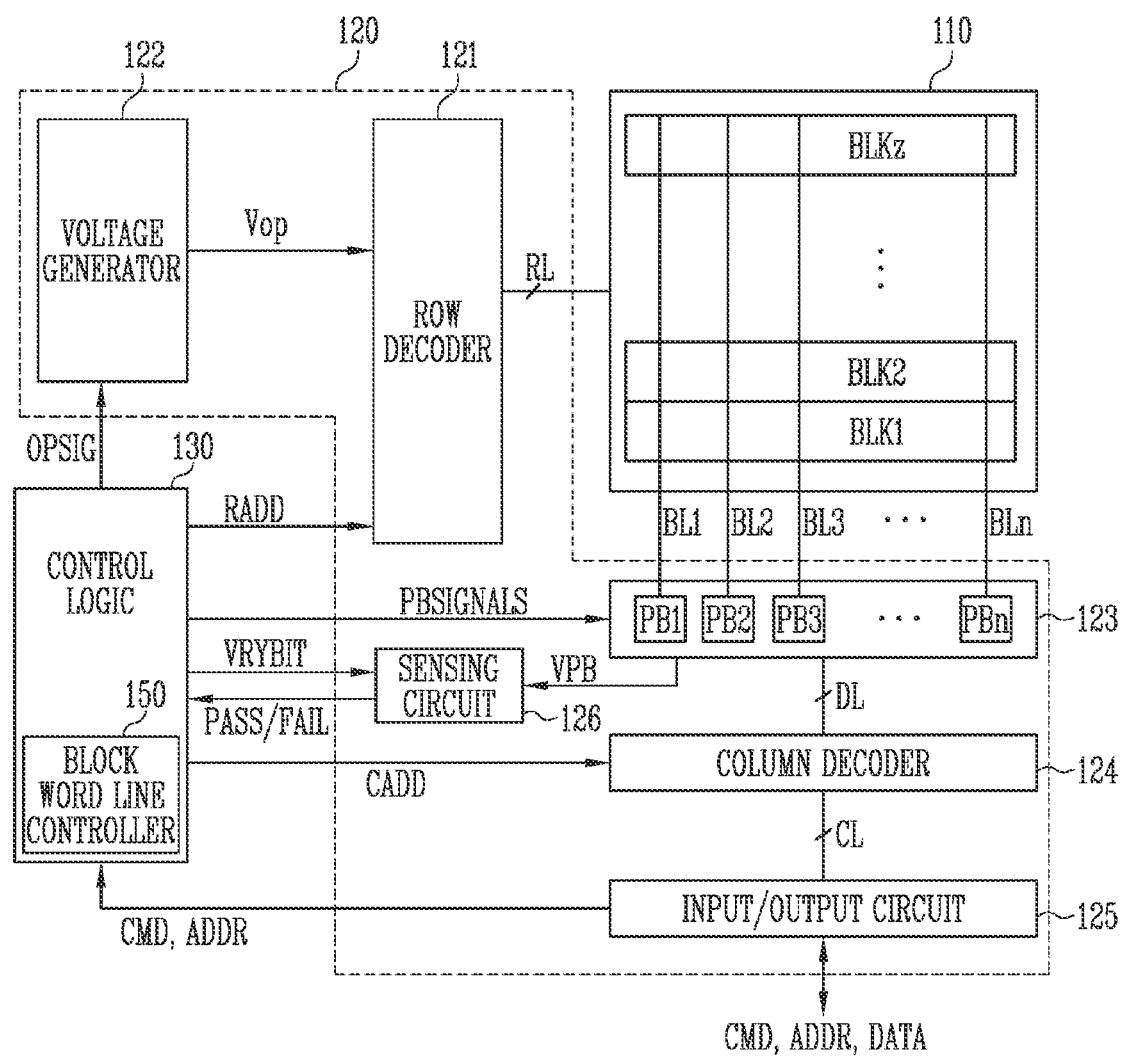
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to nth page buffers PB1 to PBn. The first to nth page buffers PB1 to PBn are respectively coupled to the memory cell array 110 through the first to nth bit lines BL1 to BLn. The first to nth page buffers PB1 to PBn are operated under the control of the control logic 130. In detail, the first to nth page buffers PB1 to PBn may be operated in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

In detail, during a program operation, when the program voltage is applied to the selected word line, the first to nth page buffers PB1 to PBn may transfer the data DATA, received through the input/output circuit 125, to selected memory cells through the first to nth bit lines BL1 to BLn. The memory cells in the selected page are programmed based on the received data DATA. During a program verify operation, the first to nth page buffers PB1 to PBn may read page data by sensing the voltages or currents received through the first to nth bit lines BL1 to BLn from the selected memory cells.

During a read operation, the first to nth page buffers PB1 to PBn may read data DATA from the memory cells in the selected page through the first to nth bit lines BL1 to BLn, and may output the read data DATA to the input/output circuit 125 under the control of the column decoder 124.

During the erase operation, the first to nth page buffers PB1 to PBn may allow the first to nth bit lines BL1 to BLn to float or may apply the erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller (e.g., 200 of FIG. 1) described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR. For example, the control logic 130 may control a read operation on a selected memory block in response to a sub-block read command and an address. Also, the control logic 130 may control an erase operation on a selected sub-block included in a selected memory block in response to a sub-block erase command and an address. In addition, the control logic 130 may determine whether a verify operation has passed or failed in response to the pass or fail signal PASS or FAIL. The control logic 130 may be implemented as hardware, software, or a combination of hardware and software. For example, the control logic 130 may be a control logic circuit operating in accordance with an algorithm and/or a processor executing control logic code.

In an embodiment, the control logic 130 may include a block word line controller 150. In an embodiment, the block word line controller 150 may be disposed outside the control logic 130.

In an embodiment, the block word line controller 150 may control a sensing operation of the memory device 100. The sensing operation may be either a read operation or a verify operation included in a program loop.

For example, the block word line controller 150 may control operations subsequent to a recovery operation corresponding to channel negative boosting that occurs after equalizing has been performed during the sensing operation.

In detail, the block word line controller 150 may control the block word line so that transistors coupled to the block word line are turned on only for a preset time after the recovery operation. Here, the block word line controller 150 may control transistors coupled to the block word line when the memory device 100 is in an idle state or a ready state. The preset time may be a period included in the time duration during which the memory device 100 is in an idle state.

Figure 3:
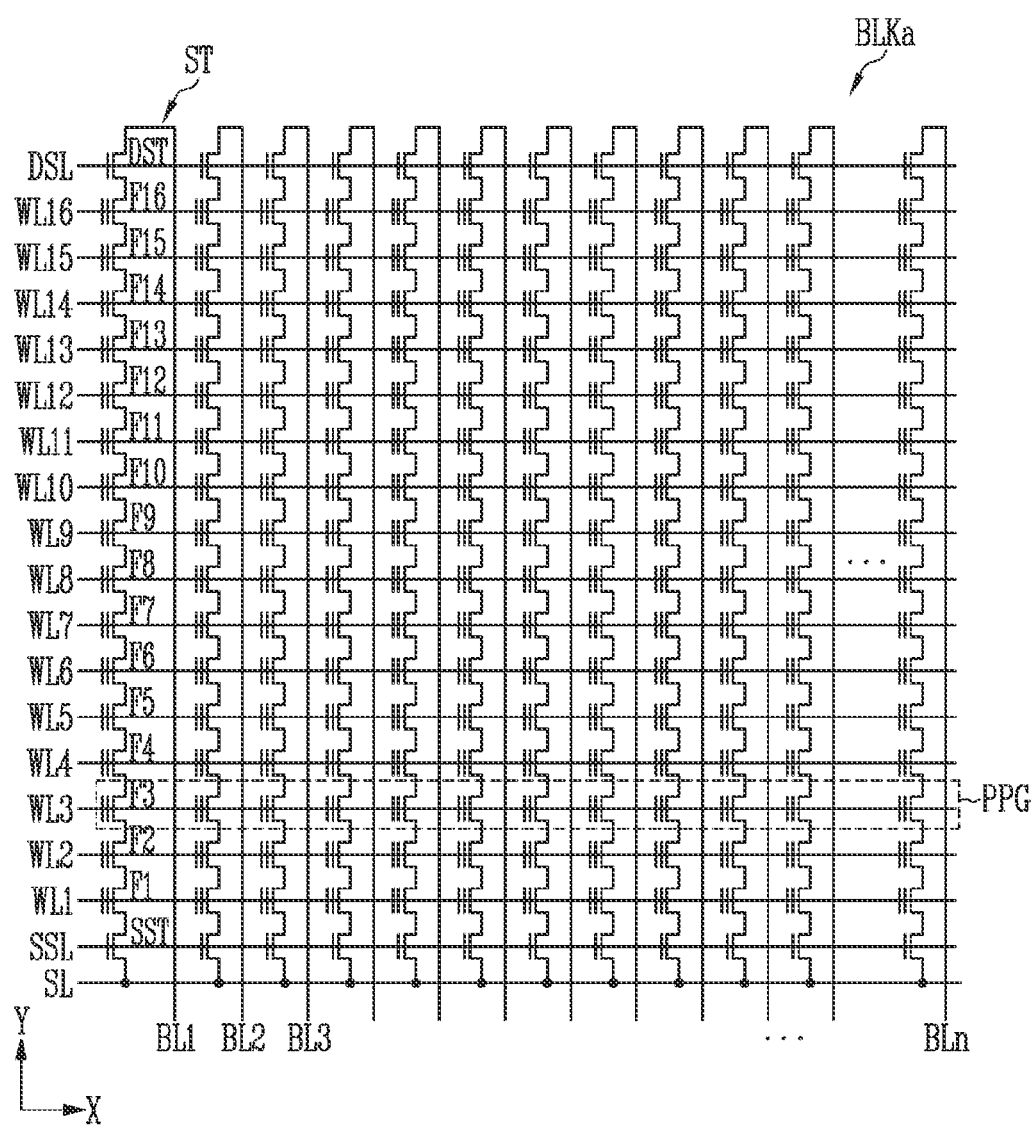
FIG. 3 is a diagram illustrating an embodiment of a memory cell array of FIG. 2.

FIG. 3 is a diagram illustrating an embodiment of a memory block of the memory cell array 110 of FIG. 2.

Referring to FIGS. 2 and 3, FIG. 3 is a circuit diagram illustrating any one memory block BLKa of a plurality of memory blocks BLK1 to BLKz included in the memory cell array 110 of FIG. 2.

The memory block BLKa may be coupled to a first select line, word lines, and a second select line that are coupled in parallel to each other. For example, the word lines may be coupled in parallel to each other between the first and second select lines. Here, the first select line may be a source select line SSL, and the second select line may be a drain select line DSL.

In detail, the memory block BLKa may include a plurality of strings coupled between bit lines BL1 to BLn and a source line SL. The bit lines BL1 to BLn may be coupled to the strings, respectively, and the source line SL may be coupled in common to the strings. Because the strings may be equally configured, a string ST coupled to the first bit line BL1 is described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings ST may be coupled to the source select line SSL, gates of the drain select transistors included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKa may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory cell in which two or more bits of data are stored in one memory cell is called a multi-level cell (MLC). However, recently, as the number of data bits stored in one memory cell increases, the multi-level cell (MLC) refers to a memory cell in which two bits of data are stored, and thus a memory cell in which three bits of data are stored is called a triple-level cell (TLC) and a memory cell in which four bits of data are stored is called a quadruple-level cell (QLC). In addition, a memory cell scheme in which multiple bits of data are stored has been developed, and the present teachings may be applied to the memory device 100 in which memory cells are used that store two or more bits of data.

In an embodiment, each of the memory blocks may have a three-dimensional (3D) structure. Each of the memory blocks may include a plurality of memory cells stacked on a substrate. The plurality of memory cells are arranged in +X, +Y, and +Z directions.

Figure 4:
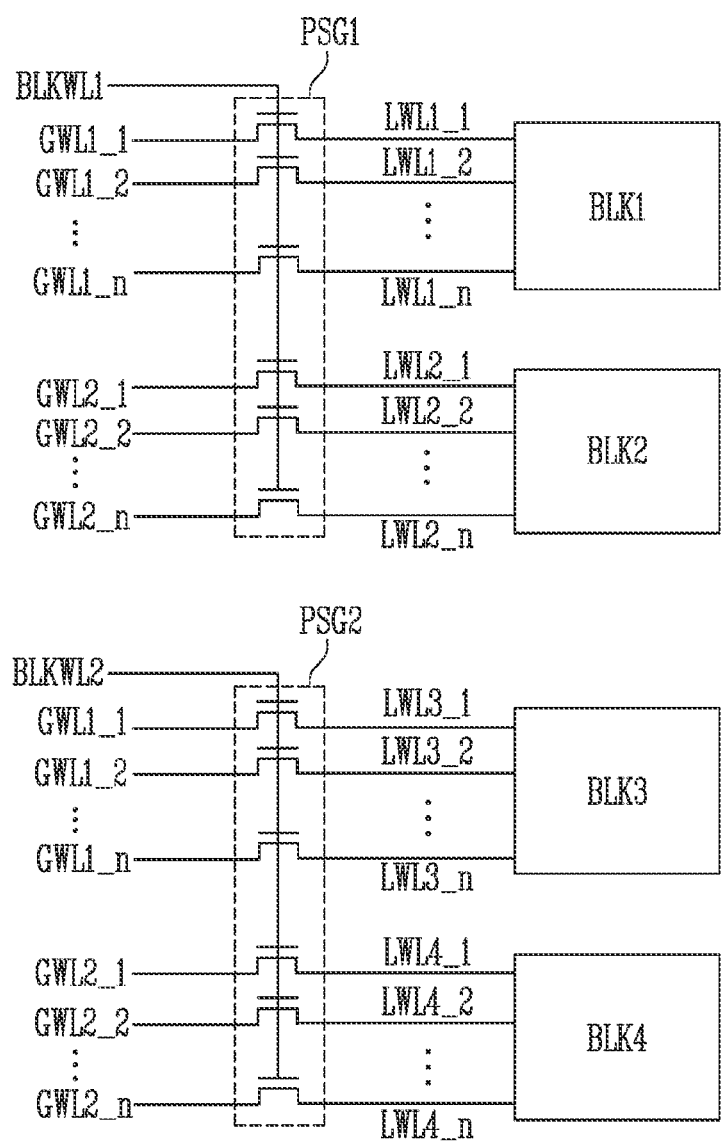
FIG. 4 is a diagram for describing local word lines, global word lines, and block word lines.

FIG. 4 is a diagram for describing local word lines, global word lines, and block word lines.

Referring to FIGS. 2 and 4, first to fourth memory blocks BLK1 to BLK4, among the plurality of memory blocks BLK1 to BLKz of FIG. 2, are illustrated in FIG. 4. In FIG. 4, it is assumed that the remaining memory blocks other than the first to fourth memory blocks BLK1 to BLK4 are omitted.

In FIG. 4, it is assumed that the memory device (e.g., 100 of FIG. 2) has a single plane structure. Therefore, the memory device of FIG. 4 (e.g., 100 of FIG. 2) has a single plane structure, that is, one plane structure, and a single plane may include the first to fourth memory blocks BLK1 to BLK4.

In an embodiment, the first memory block BLK1 may be coupled to 1_1-th to 1_n-th local word lines LWL1_1 to LWL1_n. That is, a plurality of memory cells included in the first memory block BLK1 may be coupled to the 1_1-th to 1_n-th local word lines LWL1_1 to LWL1_n.

Similarly, the second memory block BLK2 may be coupled to 2_1-th to 2_n-th local word lines WL2_1 to LWL2_n, the third memory block BLK3 may be coupled to 3_1-th to 3_n-th local word lines LWL3_1 to LWL3_n, and the fourth memory block BLK4 may be coupled to 4_1-th to 4_n-th local word lines LWL4_1 to LWL4_n.

In an embodiment, 1_1-th to 1_n-th global word lines GWL1_1 to GWL1_n may be selectively coupled to the first and third memory blocks BLK1 and BLK3 through first and second pass switch groups PSG1 and PSG2. 2_1-th to 2_n-th global word lines GWL2_1 to GWL2_n may be selectively coupled to the second and fourth memory blocks BLK2 and BLK4 through the first and second pass switch groups PSG1 and PSG2.

In an embodiment, the first pass switch group PSG1 may include a plurality of pass switches that are turned on or off in response to a voltage applied to a first block word line BLKWL1, where the plurality of pass switches may be implemented as NMOS transistors. The second pass switch group PSG2 may include a plurality of pass switches that are turned on or off in response to a voltage applied to a second block word line BLKWL2, where the plurality of pass switches may be implemented as NMOS transistors.

When a turn-on voltage is applied to the first and second block word lines BLKWL1 and BLKWL2 and the pass switches included in the first and second pass switch groups PSG1 and PSG2 are turned on, the 1_1-th to 1_n-th global word lines GWL1_1 to GWL1_n may be coupled in common to the first and third memory blocks BLK1 and BLK3, and the 2_1-th to 2_n-th global word lines GWL2_1 to GWL2_n may be coupled in common to the second and fourth memory blocks BLK2 and BLK4.

When a turn-on voltage is applied to the first block word line BLKWL1 and a turn-off voltage is applied to the second block word line BLKWL2, the pass switches included in the first pass switch group PSG1 may be turned on, and the pass switches included in the second pass switch group PSG2 may be turned off. Therefore, the 1_1-th to 1_n-th global word lines GWL1_1 to GWL1_n are coupled to the first memory block BLK1 and are not coupled to the third memory block BLK3. Further, the 2_1-th to 2_n-th global word lines GWL2_1 to GWL2_n are coupled to the second memory block BLK2 and are not coupled to the fourth memory block BLK4.

In contrast, when a turn-off voltage is applied to the first block word line BLKWL1 and a turn-on voltage is applied to the second block word line BLKWL2, the pass switches included in the first pass switch group PSG1 may be turned off, and the pass switches included in the second pass switch group PSG2 may be turned on. Therefore, the 1_1-th to 1_n-th global word lines GWL1_1 to GWL1_n are coupled to the third memory block BLK3 and are not coupled to the first memory block BLK1. Further, the 2_1-th to 2_n-th global word lines GWL2_1 to GWL2_n are coupled to the fourth memory block BLK4 and are not coupled to the second memory block BLK2.

Consequently, a memory block may be selected based on the voltage applied to the corresponding block word line, and an operating voltage output from the voltage generator (e.g., 122 of FIG. 2) may be transmitted to a selected memory block through the global word lines and the pass switch groups.

Figure 5:
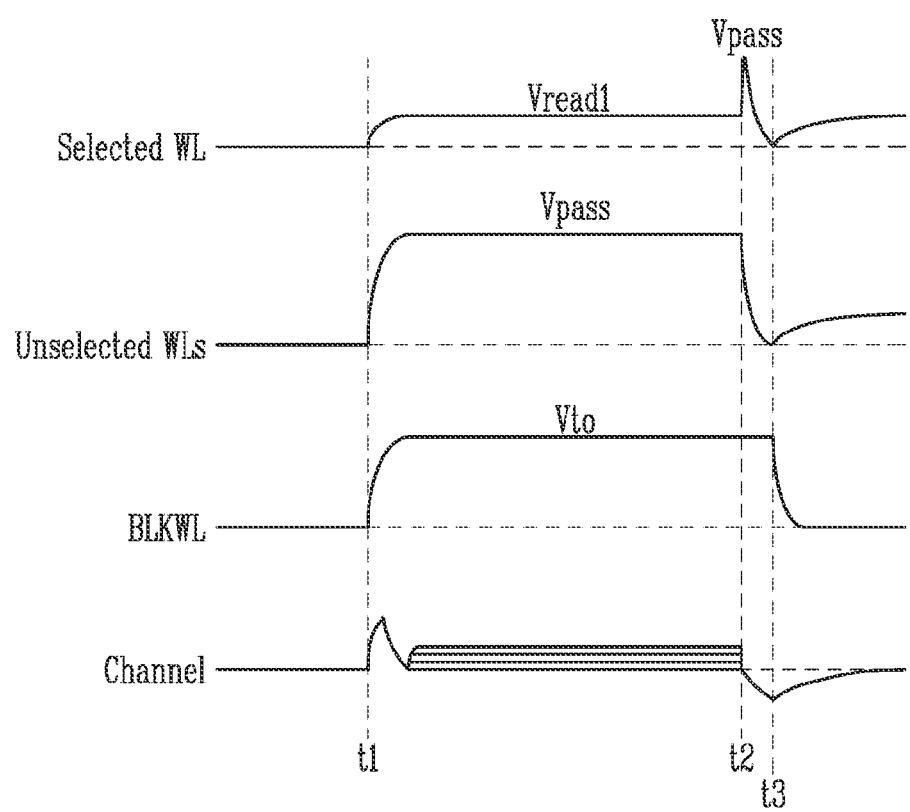
FIG. 5 is a diagram illustrating changes in voltages applied to respective lines and a channel potential during a sensing operation.

FIG. 5 is a diagram illustrating changes in voltages applied to respective lines and a channel potential during a sensing operation.

Referring to FIGS. 4 and 5, FIG. 5 illustrates changes in voltages applied to a selected word line Selected WL, unselected word lines Unselected WLs, and a block word line BLKWL and in a channel potential during a sensing operation performed on the selected word line Selected WL, among the plurality of local word lines LWL1_1 to LWL1_n, LWL2_1 to LWL2_n, LWL3_1 to LWL3_n, and LWL4_1 to LWL4_n of FIG. 4. The sensing operation may be a read operation or a verify operation.

In FIG. 5, it is assumed that the selected word line Selected WL, among the plurality of word lines, is the 1_1-th local word line LWL1_1 and the remaining local word lines are unselected word lines Unselected WLs. Because the 1_1-th local word line LWL1_1 is the selected word line, memory cells coupled to the 1_1-th local word line LWL1_1, among the memory cells in the first memory block BLK1, may be the selected memory cells.

In an embodiment, at time t1, a sensing operation may be performed. The sensing operation may be an operation of sensing the 1_1-th local word line LWL1_1 that is the selected word line Selected WL. That is, at time t1, the sensing operation may be a read operation or a verify operation on the selected memory cells coupled to the 1_1-th local word line LWL1_1.

During the sensing operation on the selected memory cells coupled to the word line Selected WL, the control logic (e.g., 130 of FIG. 2) may control the peripheral circuit (e.g., 120 of FIG. 2) so that the sensing operation is performed by applying a turn-on voltage to the first block word line BLKWL1 and applying a sensing voltage to the 1_1-th global word line GWL1_1.

Further, the control logic (e.g., 130 of FIG. 2) may control the peripheral circuit (e.g., 120 of FIG. 2) so that the sensing operation is performed by applying a turn-off voltage to the second block word line BLKWL2 and applying a pass voltage Vpass to the remaining global word lines other than the 1_1-th global word line GWL1_1.

As a result, the voltage level of the 1_1-th local word line LWL1_1 that is the selected word line Selected WL may be set to a sensing voltage level, and the voltage level of the 1_2-th to 1_n-th local word lines LWL1_2 to LWL1_n may be set to the pass voltage Vpass, and thus the sensing operation may be performed.

At time t1, the voltage applied to the selected word line Selected WL may be a first read voltage Vread1. The first read voltage Vread1 may be a voltage for distinguishing an erased state and program states of the selected memory cells coupled to the selected word line Selected WL from each other. In other embodiments, the voltage applied to the selected word line Selected WL may be a first verify voltage.

The first verify voltage may be a voltage for determining whether the selected memory cells coupled to the selected word line Selected WL have been programmed to a target program state. The first read voltage Vread1 and the first verify voltage may be sensing voltages.

At time t1, the voltage that is applied to the unselected word lines Unselected WLs may be a pass voltage Vpass. The pass voltage Vpass may be a voltage for turning on the memory cells coupled to the word lines except the selected word line Selected WL. The voltage applied to the unselected word lines Unselected WLs may be maintained at the pass voltage Vpass until the sensing operation is completed. That is, until the first and second read operations or the first and second verify operations are completed, the pass voltage Vpass may be applied to the unselected word lines Unselected WLs.

At time t1, the voltage applied to the block word line BLKWL may be a turn-on voltage Vto. The turn-on voltage Vto may be a voltage for turning on the pass switches included in the first pass switch group PSG1 coupled to the block word line BLKWL. At time t1, the voltage applied to the block word line BLKWL may be maintained at the level of the turn-on voltage Vto until all word lines are discharged after equalizing has been performed. That is, until all word lines enter a ground state, the pass switches included in the first pass switch group PSG1 coupled to the block word line BLKWL may remain turned on.

At time t1, when the first sensing voltage is applied to the selected word line Selected WL and the pass voltage Vpass is applied to the unselected word lines Unselected WLs, the sensing operation may be initiated. In an embodiment, the first sensing voltage may be the first read voltage Vread1 or the first verify voltage. After the sensing operation is initiated, programmed data stored in the memory cells coupled to the selected word line may be sensed through bit lines respectively coupled to the memory cells.

In an embodiment, the data sensed through the bit lines may be stored in the page buffer group of FIG. 2 (e.g., 123 of FIG. 2). The sensed data may be read data or verify data. The read data may be data that is read through the bit lines so as to read the data programmed to the memory cells. The verify data may be data that is read through the bit lines so as to verify the data programmed to the memory cells. The program states of the memory cells may be determined based on the sensed data.

In an embodiment, the channel potential may be the potential of a channel of a plurality of memory cells coupled to any one of a plurality of cell strings coupled to the bit lines. Before the sensing operation is performed, the channel potential may be 0 V.

At time t1, the channel potential may instantaneously or quickly increase, and may then return to 0 V. In detail, with the initiation of the sensing operation, the sensing voltage may be applied to the selected word line Selected WL, and the pass voltage Vpass may be applied to the unselected word lines Unselected WLs. When the sensing voltage and the pass voltage Vpass are applied to the selected word line Selected WL and the unselected word lines Unselected WLs, respectively, channel coupling between word lines may occur. When channel coupling between word lines occurs, the channel potential may increase. The increased channel potential may return to 0 V after a predetermined time has elapsed.

The channel potential having returned to 0 V may have various levels depending on the program state of the memory cells. That is, because the plurality of memory cells coupled to the cell string may have various program states, currents flowing through the plurality of memory cells may vary depending on the voltages applied to the word lines. As a result, the channel potential may have various values depending on the program states of the plurality of memory cells coupled to the cell string.

The channel potential may return to 0 V after the sensing operation has been terminated. That is, when the plurality of word lines are discharged, the bit lines may also be discharged, and thus the channel potential may return to 0 V.

In an embodiment, after the sensing operation has been performed, an equalizing operation may be performed. The equalizing operation may be an operation of simultaneously discharging the plurality of word lines coupled to the memory block. The plurality of word lines coupled to the memory block may include a selected word line Selected WL and unselected word lines Unselected WLs.

Assuming that a discharge operation is performed on the word lines without an equalizing operation being performed, voltage levels that are applied to the selected word line Selected WL and the unselected word lines Unselected WLs are different from each other, and thus time points at which the discharge operation is to be completed may differ from each other. Therefore, the potential of the selected word line Selected WL may be set to the pass voltage Vpass so that discharging of the plurality of word lines can be completed at the same time.

In detail, after the first read operation or the first verify operation is performed, the pass voltage Vpass may be applied to the selected word line Selected WL. After the pass voltage Vpass has been applied to the selected word line Selected WL, the selected word line Selected WL and the unselected word lines Unselected WLs may all be simultaneously discharged from the same pass voltage Vpass. That is, when the potential of the selected word line Selected WL is set to the pass voltage Vpass at time t2, and the potentials of all word lines including the selected word line Selected WL are set to the same pass voltage Vpass, all of the word lines may be simultaneously discharged during a common period from time t2 to time t3 by the same amount.

In an embodiment, because the program states of the plurality of memory cells coupled to the cell string are different from each other, the cut-off time points of the plurality of memory cells may vary during discharging of the bit lines. Because the cut-off time points of the plurality of memory cells vary, capacitance coupling may occur between the word lines, and the channel potential may have a negative value due to the occurrence of capacitance coupling. As a result, the cut-off time points of the plurality of memory cells vary, thus resulting in channel negative boosting.

As channel negative boosting occurs, the channel potential may have a negative value. During the period from time t2 to time t3, the channel potential changes to a negative potential due to channel negative boosting, after which the channel potential may return to 0 V due to a recovery operation at time t3.

In an embodiment, during the recovery operation, the potentials of the word lines may also increase together with the channel potential due to coupling between the channel and the word lines. After the potentials of the word lines have increased, a considerable time has elapsed with the potentials of the word lines increased, and thus the threshold voltage levels of the memory cells in an erased state may increase due to retention. That is, cell stress on the memory cells in the erased state may increase.

Furthermore, a difference between the potential levels of the channel and the word lines occurs, and thus a refresh read operation may be repeatedly performed in the idle state or ready state of the memory device (e.g., 100 of FIG. 2). The idle state or ready state of the memory device (e.g., 100 of FIG. 2) may be a state in which, after the corresponding operation has been completed, the memory device (e.g., 100 of FIG. 2) is waiting for a subsequent operation to be performed, that is, a state in which no operation is performed.

In an embodiment, as a refresh read operation is repeatedly performed, an uncorrectable error correction code (UECC) fail in which errors in the sensed data are uncorrectable may occur.

Therefore, the present disclosure proposes a method of preventing a phenomenon in which the threshold voltage levels of memory cells change from occurring by reducing the time during which the potential levels of word lines are maintained at positive values.

Figure 6:
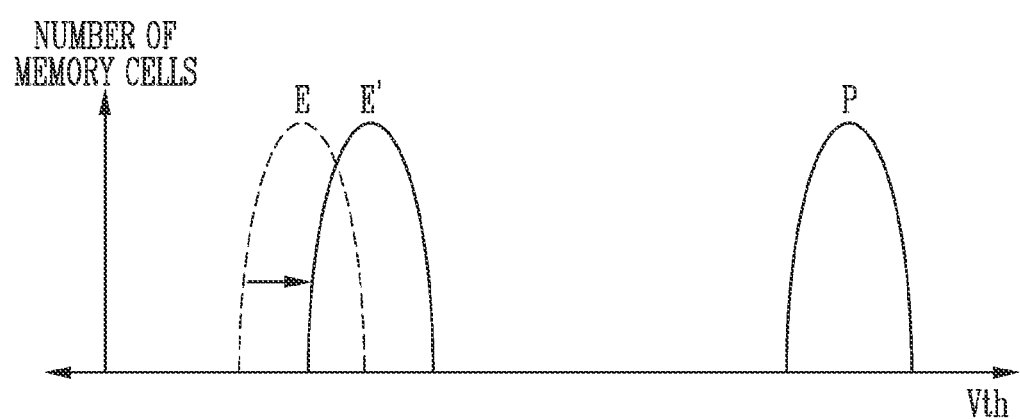
FIG. 6 is a diagram illustrating shifting of a threshold voltage distribution in an erased state attributable to an increase in the potentials of word lines.

FIG. 6 is a diagram illustrating the shifting of a threshold voltage distribution in an erased state attributable to an increase in the potentials of word lines.

Referring to FIG. 6, threshold voltage distributions of memory cells are illustrated. In FIG. 6, it is assumed that a memory device (e.g., 100 of FIG. 2) performs a program operation using a single-level cell (SLC) scheme. Therefore, the memory cells may be in an erased state E or a program state P.

In other embodiments, FIG. 6 may also be applied to a case where the memory device (e.g., 100 of FIG. 2) performs a program operation using a multi-level cell (MLC), triple-level cell (TLC), or a quadruple-level cell (QLC) scheme.

Referring to FIG. 5, when a recovery operation corresponding to channel negative boosting is performed at time t3, the potentials of the word lines may increase together with a channel potential due to coupling between the channel and the word lines.

In the state in which the potentials of the word lines increase, the floating of the word lines continues, and thus memory cells may be degraded. That is, retention of the memory cells may occur.

In an embodiment, the threshold voltages of memory cells in an erased state E may increase to E' due to retention of the memory cells. That is, stress on the memory cells may increase.

Furthermore, as the threshold voltages of the memory cells in an erased state E increase, a refresh read operation is repeatedly performed. With the repetition of the refresh read operation, a UECC fail in which errors in the sensed data are uncorrectable may occur.

In order to prevent the above-described UECC fail from occurring, a method of discharging word lines in the idle state or the ready state of the memory device (e.g., 100 of FIG. 2) is described in subsequent drawings.

Figure 7:
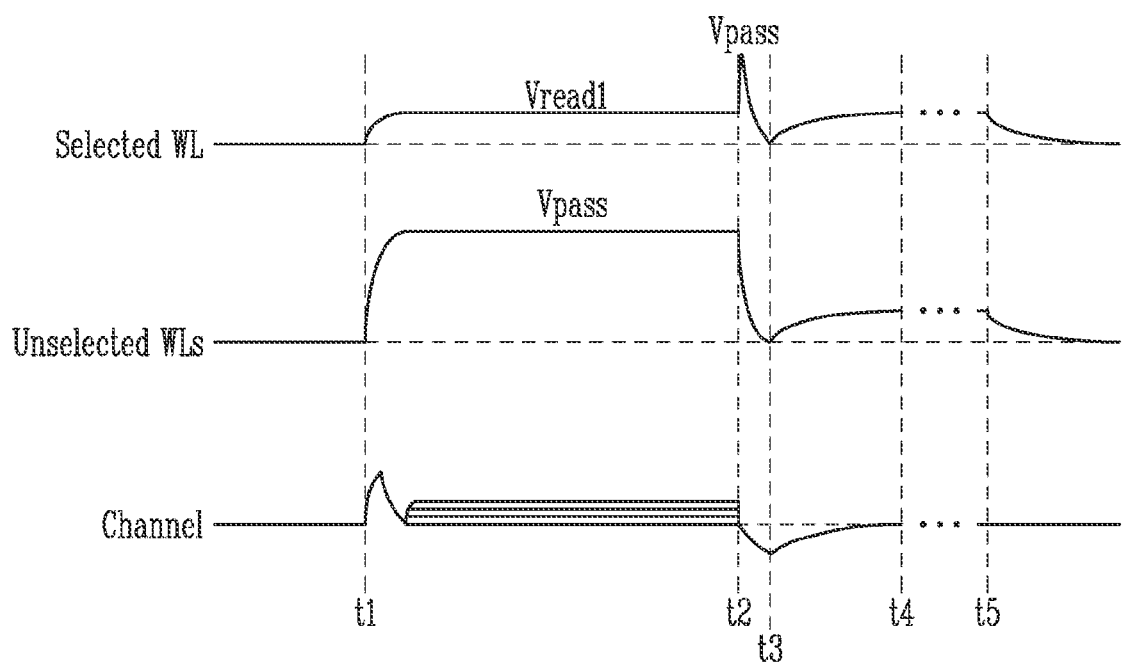
FIG. 7 is a diagram illustrating potentials of word lines that have changed by discharging the word lines after a recovery operation.

FIG. 7 is a diagram illustrating potentials of word lines that have changed by discharging the word lines after a recovery operation.

Referring to FIGS. 5 and 7, FIG. 7 illustrates a process for discharging word lines in an idle time or ready time of a memory device (e.g., 100 of FIG. 2) after the recovery operation corresponding to channel negative boosting has been performed at time t3 of FIG. 5.

In FIG. 7, before time t4, changes in the voltages applied to respective lines and in a channel potential are identical to those of FIG. 5, and thus repeated descriptions thereof will be omitted.

Referring to FIG. 5, due to the recovery operation corresponding to channel negative boosting performed at time t3, a channel potential may return to 0 V at time t4.

However, as the channel potential increases again from a negative value to 0 V at time t4, the potentials of the word lines may have positive values other than a ground voltage due to coupling between the channel and the word lines. That is, as the channel potential increases, the potentials of the word lines may increase together with the channel potential.

In an embodiment, in order to reset the increased potentials of the word lines to 0 V, the memory device (e.g., 100 of FIG. 2) may discharge the word lines in an idle state or a ready state. The idle state or ready state of the memory device (e.g., 100 of FIG. 2) may be a state in which, after the corresponding operation has been completed, the memory device (e.g., 100 of FIG. 2) is waiting for a subsequent operation to be performed, that is, a state in which no operation is performed.

In detail, after the recovery operation corresponding to channel negative boosting has been performed, the word lines may float to positive voltages.

In an embodiment, time elapses in the state in which the potentials of the word lines have increased, and then the memory device (e.g., 100 of FIG. 2) may enter an idle state or ready state at time t5.

Therefore, because the memory device (e.g., 100 of FIG. 2) is in the ready state at time t5, the memory device (e.g., 100 of FIG. 2) may discharge the word lines by turning on transistors coupled to a first block word line BLKWL1, that is, the transistors in the first pass switch group PSG1 of FIG. 4.

In detail, at time t5, the memory device (e.g., 100 of FIG. 2) may apply a positive voltage to the first block word line BLKWL1. Therefore, as the transistors in the first pass switch group PSG1 are turned on, the potentials of the 1_1-th to 1_n-th local word lines LWL1_1 to LWL1_*n* may decrease.

Consequently, during the sensing operation, the memory device (e.g., 100 of FIG. 2) discharges word lines, which have floated to positive voltages after the recovery operation corresponding to the channel negative boosting has been performed, in the idle state or ready state, thus preventing or mitigating a phenomenon in which the threshold voltage levels of memory cells change.

Figure 8:
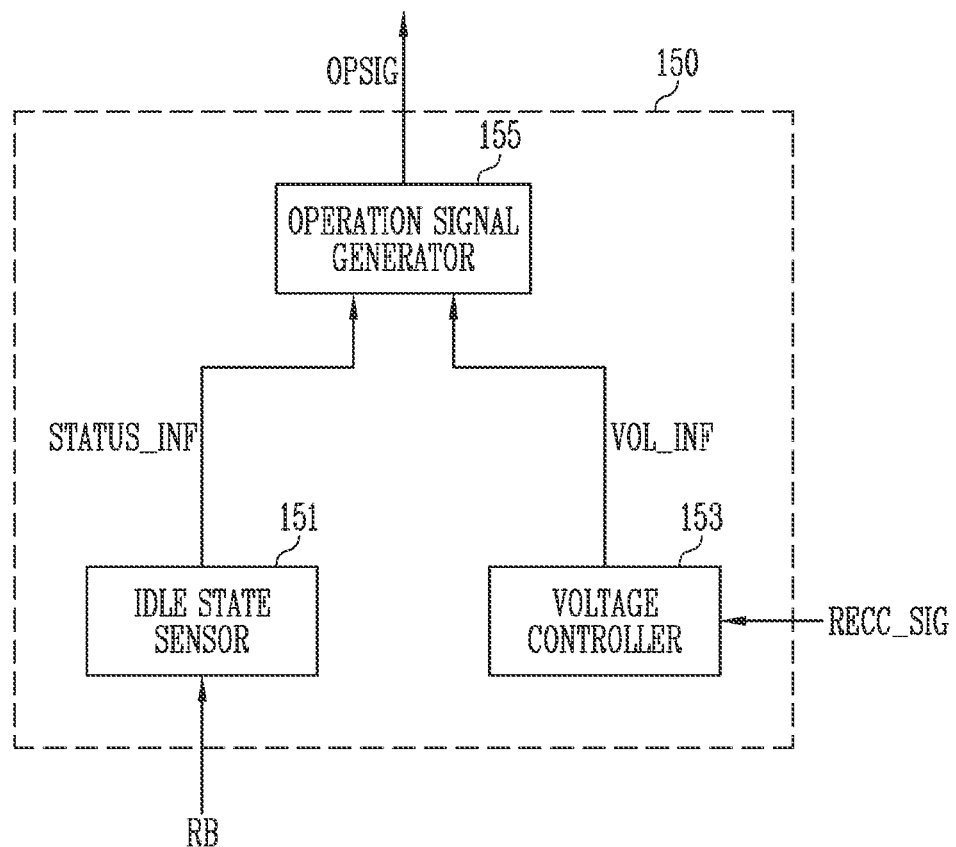
FIG. 8 is a diagram illustrating the configuration of a block word line controller.

FIG. 8 is a diagram illustrating the configuration of the block word line controller 150 of FIGS. 1 and 2.

Referring to FIG. 8, the block word line controller 150 may include an idle state sensor 151, a voltage controller 153, and an operation signal generator 155.

In an embodiment, the idle state sensor 151 may sense whether the memory device (e.g., 100 of FIG. 2) is in an idle state. The idle state of the memory device (e.g., 100 of FIG. 2) may be the ready state of the memory device (e.g., 100 of FIG. 2).

For example, the idle state sensor 151 may determine, based on a ready/busy signal RB or a signal internally generated by the memory device (e.g., 100 of FIG. 2), whether the memory device (e.g., 100 of FIG. 2) is in an idle state.

The idle state sensor 151 may generate and output status information STATUS_INF based on the result of determining whether the memory device (e.g., 100 of FIG. 2) is in an idle state. Here, the status information STATUS_INF may include information related to whether the memory device (e.g., 100 of FIG. 2) is in an idle state.

In an embodiment, the voltage controller 153 may control the voltage level to be applied to a block word line. The block word line controlled by the voltage controller 153 may be a word line coupled to a transistor to which a local word line and a global word line, corresponding to the selected word line, are coupled.

Referring to FIGS. 4 and 5, the selected word line Selected WL is a 1_1-th local word line LWL1_1, and thus the voltage controller 153 may control a voltage level to be applied to a first block word line BLKWL1 coupled to a gate of a transistor for coupling the 1_1-th local word line LWL1_1 to the 1_1-th global word line GWL1_1.

In an embodiment, when the voltage controller 153 receives a recovery operation completion signal RECC_SIG, the voltage controller 153 may output voltage information VOL_INF including information about a voltage level to be applied to the block word line. Here, the recovery operation completion signal RECC_SIG may be a signal indicating that, after an equalizing operation of setting the potential of the selected word line to a pass voltage level during a sensing operation, a recovery operation corresponding to channel negative boosting caused by the discharging of the word lines has been completed.

That is, in order to again reduce the increased potentials of the word lines after the recovery operation corresponding to channel negative boosting has been completed, the voltage controller 153 may set the voltage level to be applied to the block word line.

In an embodiment, the operation signal generator 155 may generate an operation signal OPSIG based on status information STATUS_INF and voltage information VOL_INF, and may output the operation signal OPSIG. Here, the status information STATUS_INF may be output from the idle state sensor 151, and the voltage information VOL_INF may be output from the voltage controller 153.

In detail, when the status information STATUS_INF output from the idle state sensor 151 indicates that the memory device (e.g., 100 of FIG. 2) is in an idle state, and voltage information VOL_INF including information about the voltage level to be applied to the block word line is received from the voltage controller 153, the operation signal generator 155 may output the operation signal OPSIG. Here, the operation signal OPSIG may be a signal that instructs the voltage having a level corresponding to the voltage information VOL_INF to be applied to the block word line. For example, the operation signal OPSIG may be output to the voltage generator of FIG. 2 (e.g., 122 of FIG. 2).

That is, after the memory device (e.g., 100 of FIG. 2) performs a sensing operation, a voltage level for discharging the word lines in the idle state of the memory device (e.g., 100 of FIG. 2) may be set, and a voltage having the set level may be applied to the block word line.

The voltage level applied to the block word line in the idle state of the memory device (e.g., 100 of FIG. 2) is described in detail below with reference to FIG. 9.

Figure 9:
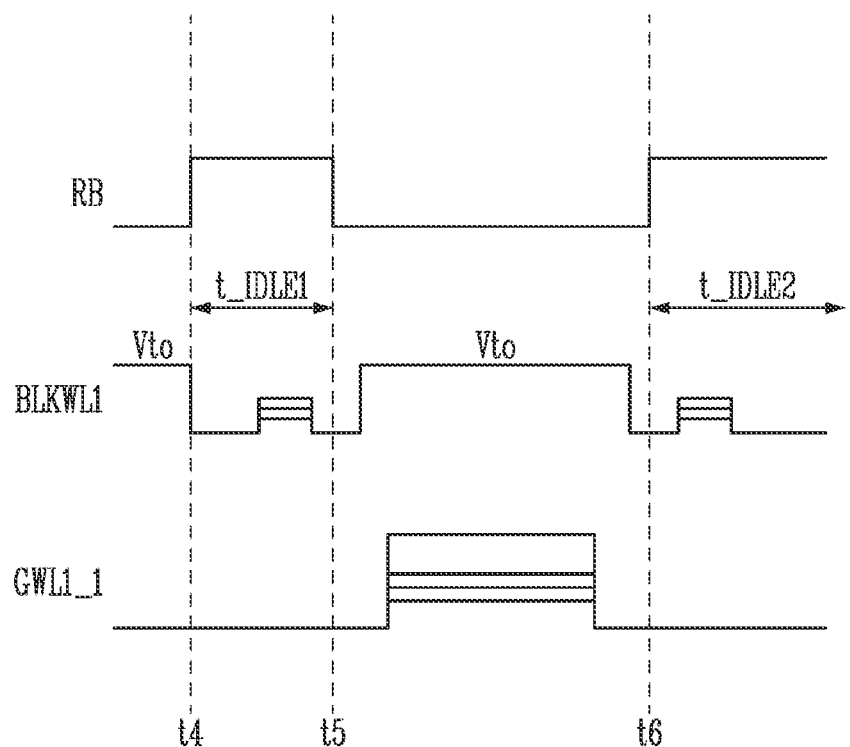
FIG. 9 is a diagram illustrating voltages applied to a block word line to discharge word lines.

FIG. 9 is a diagram illustrating voltages applied to a block word line to discharge word lines.

Referring to FIG. 9, a ready/busy signal RB indicating the ready state or the busy state of the memory device (e.g., 100 of FIG. 2), a voltage level applied to a first block word line BLKWL1, and a voltage level applied to a 1_1-th global word line GWL1_1 are illustrated in FIG. 9.

Referring to FIGS. 4, 5, and 9, the selected word line Selected WL is a 1_1-th local word line LWL1_1, and thus the first block word line BLKWL1 may be a word line coupled to the gate of a transistor for coupling the 1_1-th local word line LWL1_1 to the 1_1-th global word line GWL1_1 in FIG. 9. Further, referring to FIGS. 7 and 9, time t4 may be a time point at which a recovery operation corresponding to channel negative boosting is completed in FIG. 9.

In an embodiment, before time t4, the memory device (e.g., 100 of FIG. 2) is performing a recovery operation corresponding to channel negative boosting, and thus the ready/busy signal RB may be in a low state. That is, the ready/busy signal RB may indicate the busy state of the memory device (e.g., 100 of FIG. 2).

Further, because the memory device (e.g., 100 of FIG. 2) is performing the recovery operation before time t4, a turn-on voltage (e.g., Vto of FIG. 5) may be applied to the first block word line BLKWL1, and no voltage is applied to the 1_1-th global word line GWL1_1. That is, for the recovery operation, a voltage for turning on the transistor coupled to the first block word line BLKWL1 may be applied to the first block word line BLKWL1 before time t4.

Thereafter, the memory device (e.g., 100 of FIG. 2) may be in an idle state.

Therefore, because the memory device (e.g., 100 of FIG. 2) is in a waiting state in which an operation is not performed in the idle state, the ready/busy signal RB may be in a high state indicating the ready state of the memory device (e.g., 100 of FIG. 2). In order to decrease the potential of the word line increased by the recovery operation when the ready/busy signal RB is in a high state, that is, during the first idle time t_IDLE1 after time t4, a voltage having a level lower than a turn-on voltage (e.g., Vto of FIG. 5) may be applied to the first block word line BLKWL1. Here, the voltage level applied to the first block word line BLKWL1 may be changed to various values within a range of levels lower than the turn-on voltage (e.g., Vto of FIG. 5). For example, the voltage applied to the first block word line BLKWL1 during the first idle time t_IDLE1 may be 0 V or a voltage having a level close to 0 V relative to the turn-on voltage Vto.

Because 0 V or the voltage having a level close to 0 V is applied to the first block word line BLKWL1 during the first idle time t_IDLE1, charges trapped in the transistors coupled to the first block word line BLKWL1 may be released, and the potentials of the word lines may be decreased.

After the first idle time t_IDLE1 has elapsed, the memory device (e.g., 100 of FIG. 2) again performs the sensing operation at time t5, and thus the ready/busy signal RB may make a transition from a high state to a low state indicating the busy state of the memory device (e.g., 100 of FIG. 2).

Assuming that the memory device (e.g., 100 of FIG. 2) performs the sensing operation at time t5, a turn-on voltage (e.g., Vto of FIG. 5) may be applied to the first block word line BLKWL1, and a sensing voltage or a pass voltage may be applied to the 1_1-th global word line GWL1_1.

Thereafter, after the sensing operation of the memory device (e.g., 100 of FIG. 2) has been completed at time t6, the memory device (e.g., 100 of FIG. 2) may enter the idle state. When the memory device (e.g., 100 of FIG. 2) is in the idle state, the ready/busy signal RB may make a transition from a low state to a high state.

In order to decrease the potential of the word line increased by the recovery operation when the ready/busy signal RB is in a high state, that is, during a second idle time t_IDLE2 after time t6, a voltage having a level lower than the turn-on voltage (e.g., Vto of FIG. 5) may be applied to the first block word line BLKWL1. Here, the voltage level applied to the first block word line BLKWL1 may be changed to various values within a range of levels lower than the turn-on voltage (e.g., Vto of FIG. 5).

That is, because 0 V or the voltage having a level close to 0 V relative to the turn-on voltage Vto is applied again to the first block word line BLKWL1 during the second idle time t_IDLE2, charges trapped in the transistors coupled to the first block word line BLKWL1 may be released, and the potentials of the word lines may decrease.

As a result, in the state in which, after the sensing operation, the potentials of the word lines have floated to a positive voltage level, the memory device (e.g., 100 of FIG. 2) may apply 0 V or a voltage having a level close to 0 V to the first block word line BLKWL1. The memory device (e.g., 100 of FIG. 2) may rapidly discharge the word lines by applying 0V or the voltage having a level close to 0 V relative to the turn-on voltage Vto to the first block word line BLKWL1.

Therefore, after the sensing operation, the memory device (e.g., 100 of FIG. 2) may discharge the word lines immediately, thus preventing the threshold voltages of memory cells in an erased state from increasing.

Figure 10:
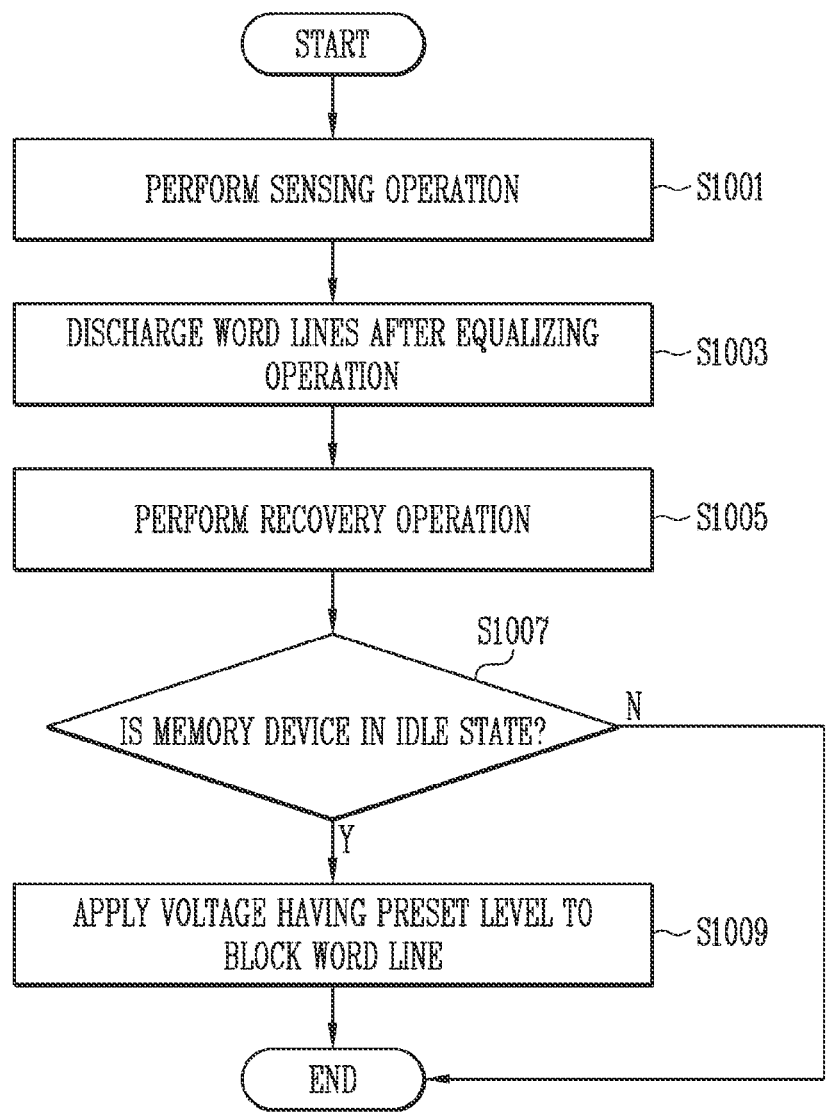
FIG. 10 is a flowchart illustrating the operation of a memory device according to an embodiment of the present disclosure.

FIG. 10 is a flowchart illustrating the operation of a memory device according to an embodiment of the present disclosure.

Referring to FIG. 10, at step S1001, the memory device may perform a sensing operation. For example, when the memory device performs the sensing operation, a sensing voltage may be applied to a selected word line, and a pass voltage may be applied to unselected word lines. The sensing operation may be performed by applying the sensing voltage to the selected word line and applying the pass voltage to the unselected word lines.

At step S1003, the memory device may discharge the word lines after an equalizing operation has been performed. In detail, while the memory device is performing the sensing operation, voltages having different levels are applied to the selected word line and the unselected word lines, and thus the equalizing operation of setting the potentials of all word lines to the same level may be performed after the sensing operation has been terminated.

After the equalizing operation, the memory device may simultaneously discharge all word lines, thus setting the potentials of all word lines to 0 V. However, after the equalizing operation has been performed, all word lines are simultaneously discharged, and thus the channel potentials of the memory cells may be simultaneously decreased. That is, channel negative boosting may occur.

Therefore, at step S1005, the memory device may perform a recovery operation corresponding to channel negative boosting. The channel potential having changed to the negative potential due to channel negative boosting may increase through a recovery operation, and may then return to 0 V.

However, during the recovery operation, the potentials of the word lines may also increase together with the channel potential due to coupling between the channel and the word lines. That is, because the potentials of the word lines may float to the state having positive voltage values, the memory device may discharge the word lines in an idle state.

At step S1007, whether the memory device is in an idle state or a ready state may be determined. When the memory device is in the idle state or the ready state (in the case of Y), the process may proceed to step S1009. The idle state of the memory device means that the memory device is in a state in which no operation is being performed while the memory device is waiting for a subsequent operation to be performed after completion of the corresponding operation.

At step S1009, the memory device may set a voltage level for discharging the word lines, and may apply a voltage having the set level to the block word line. The block word line may be a word line coupled to the gate of a transistor coupled to the selected word line. In an embodiment, the memory device may apply a voltage having the set level to the block word line for a preset time.

Figure 11:
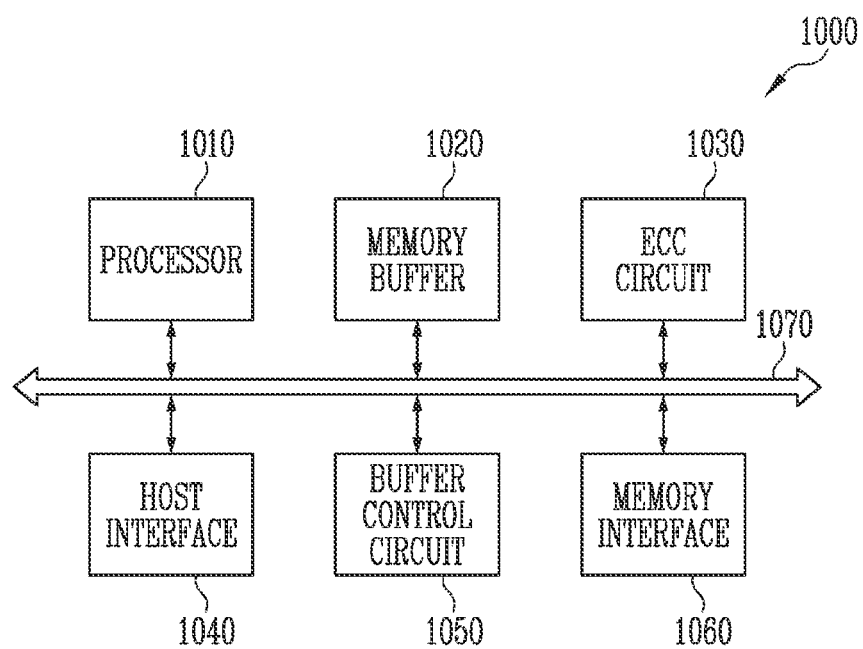
FIG. 11 is a diagram illustrating an embodiment of a memory controller of FIG. 1.

FIG. 11 is a diagram illustrating an embodiment of a memory controller 1000, which may represent the memory controller 200 of FIG. 1.

The memory controller 1000 is coupled to a host and a memory device. In response to a request received from the host, the memory controller 1000 may access the memory device. For example, the memory controller 1000 may be configured to control write, read, erase, and perform background operations on the memory device. The memory controller 1000 may provide an interface between the memory device and the host. The memory controller 1000 may run firmware for controlling the memory device.

Referring to FIG. 11, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may run software or firmware to perform the randomizing or derandomizing operation.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include static RAM (SRAM) or dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other so as not to interfere or influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 12:
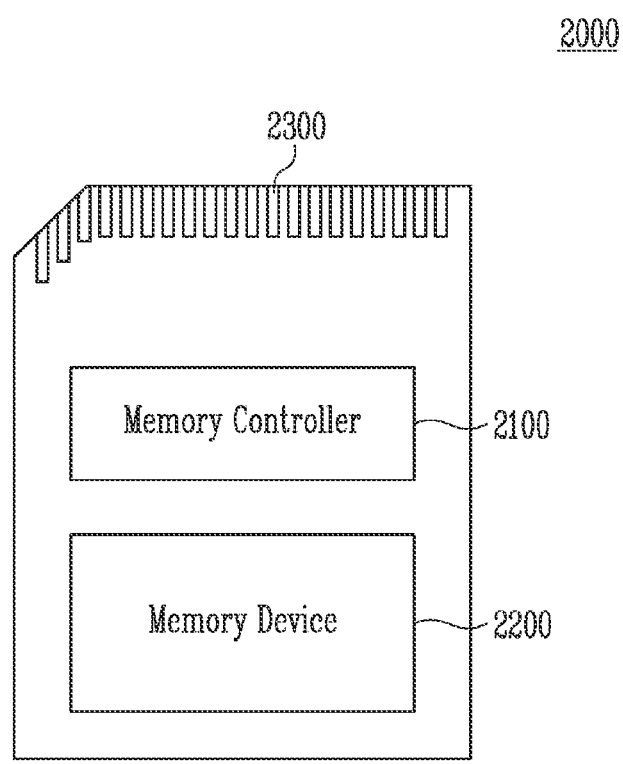
FIG. 12 is a block diagram illustrating a memory card system to which a storage device according to an embodiment of the present disclosure is applied.

FIG. 12 is a block diagram illustrating a memory card system to which a storage device according to an embodiment of the present disclosure is applied.

Referring to FIG. 12, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device (e.g., 100 of FIG. 1) described above with reference to FIG. 1.

In an embodiment, the memory controller 2100 may include components, such as RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin Transfer Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may perform a sensing operation. The sensing operation may be either a read operation or a verify operation included in a program loop.

After the memory device 2200 has performed the sensing operation, all word lines may be set to a pass voltage level depending on an equalizing operation. Thereafter, all word lines may be simultaneously discharged.

However, when all word lines are simultaneously discharged, a channel potential of the memory cells may be simultaneously decreased. That is, channel negative boosting may occur. When channel negative boosting occurs, the memory device 2200 may perform a recovery operation corresponding to the channel negative boosting.

However, during the recovery operation of the memory device 2200, the potentials of the word lines may also increase together with the channel potential due to coupling between the channel and the word lines. Therefore, in order to discharge the word lines, the memory device 2200 may apply a voltage having a preset level to a block word line that is coupled to a transistor coupled to the selected word line for a preset time in the idle state. Here, the voltage applied to the block word line may be 0 V or a voltage having a level close to 0V, and the preset time may be a period included in the time during which the memory device 2200 is in the idle state.

As a result, the voltage having the preset level is applied to the block word line for the preset time, so that charges trapped in the transistors coupled to the block word line may be released, and thus the increased potentials of the word lines may decrease and return to 0 V.

Figure 13:
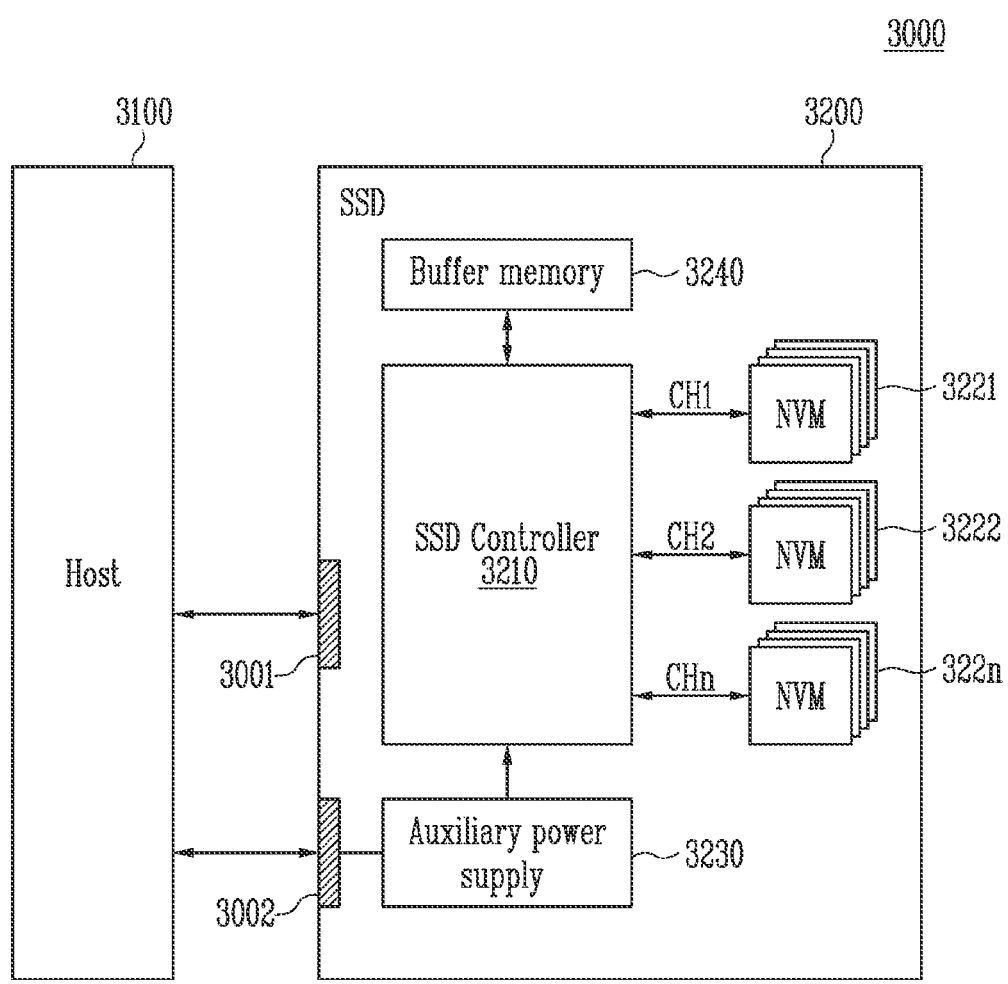
FIG. 13 is a block diagram illustrating a solid state drive (SSD) system to which a storage device according to an embodiment of the present disclosure is applied.

FIG. 13 is a block diagram illustrating an example of a solid state drive (SSD) system to which a storage device according to an embodiment of the present disclosure is applied.

Referring to FIG. 13, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller (e.g., 200 of FIG. 1) described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed on a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Each of the plurality of flash memories 3221 to 322n may perform a sensing operation. The sensing operation may be either a read operation or a verify operation included in a program loop.

After the plurality of flash memories 3221 to 322n have performed the sensing operation, all word lines may be set to a pass voltage level depending on an equalizing operation. Thereafter, all word lines may be simultaneously discharged.

However, when all word lines are simultaneously discharged, a channel potential of the memory cells may be simultaneously decreased. That is, channel negative boosting may occur. When channel negative boosting occurs, each of the plurality of flash memories 3221 to 322n may perform a recovery operation corresponding to the channel negative boosting.

When the plurality of flash memories 3221 to 322n perform the recovery operation, the potentials of the word lines may also increase together with the channel potential due to coupling between a channel and the word lines. Therefore, in order to discharge the word lines, each of the plurality of flash memories 3221 to 322n may apply a voltage having a preset level to a block word line that is coupled to a transistor coupled to a selected word line for a preset time in an idle state. Here, the voltage applied to the block word line may be 0 V or a voltage having a level close to 0V, and the preset time may be a period included in the time during which the plurality of flash memories 3221 to 322n are in the idle state.

As a result, the voltage having the preset level is applied to the block word line for the preset time, so that charges trapped in the transistors coupled to the block word line may be released, and thus the increased potentials of the word lines may decrease and return to 0 V.

Figure 14:
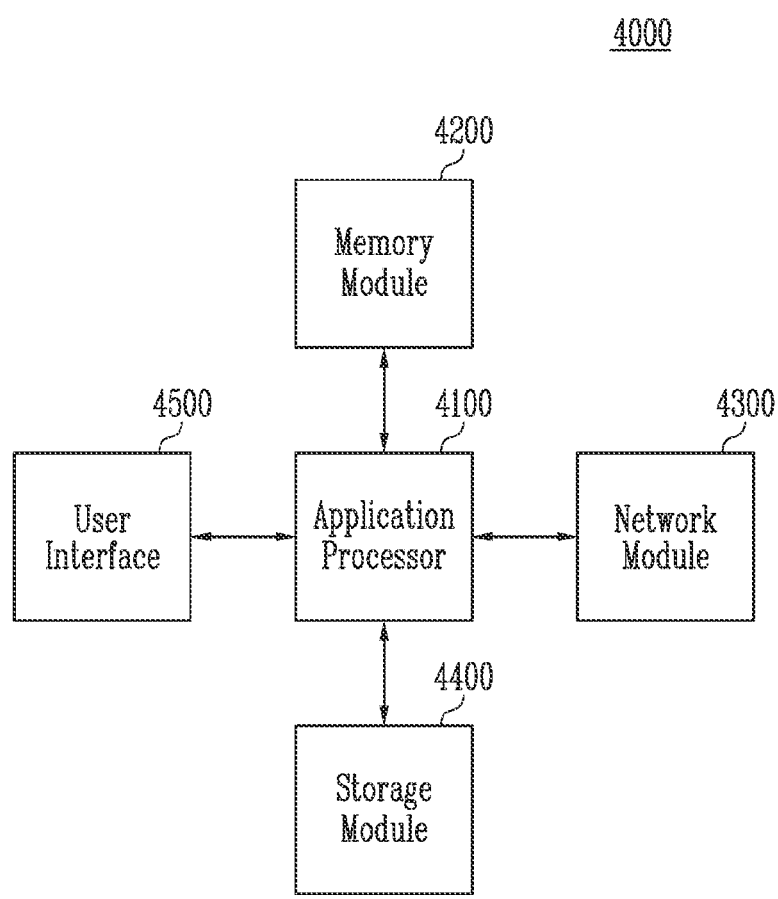
FIG. 14 is a block diagram illustrating a user system to which a storage device according to an embodiment of the present disclosure is applied.

FIG. 14 is a block diagram illustrating a user system to which the storage device according to an embodiment of the present disclosure is applied.

Referring to FIG. 14, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2 and 3. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In an embodiment, the storage module 4400 may perform a sensing operation. The sensing operation may be either a read operation or a verify operation included in a program loop.

After the storage module 4400 has performed the sensing operation, all word lines may be set to a pass voltage level depending on an equalizing operation. Thereafter, all word lines may be simultaneously discharged.

However, when all word lines are simultaneously discharged, a channel potential of the memory cells may be simultaneously decreased. That is, channel negative boosting may occur. When channel negative boosting occurs, the storage module 4400 may perform a recovery operation corresponding to the channel negative boosting.

However, during the recovery operation of the storage module 4400, the potentials of the word lines may also increase together with the channel potential due to coupling between the channel and the word lines. Therefore, in order to discharge the word lines, the storage module 4400 may apply a voltage having a preset level to a block word line that is coupled to a transistor coupled to the selected word line for a preset time in the idle state. Here, the voltage applied to the block word line may be 0 V or a voltage having a level close to 0V, and the preset time may be a period included in the time during which the storage module 4400 is in the idle state.

As a result, the voltage having the preset level is applied to the block word line for the preset time, so that charges trapped in the transistors coupled to the block word line may be released, and thus the increased potentials of the word lines may decrease and return to 0 V.

In accordance with the present disclosure, word lines are discharged by turning on transistors on a block word line coupled to the word lines for a specific time after a recovery operation corresponding to channel negative boosting during a sensing operation, thus decreasing a potential difference between the word lines and a channel.

What is claimed is:

1. A memory device, comprising:
   a memory cell array coupled to a plurality of word lines, wherein each word line is coupled to a plurality of memory cells;
   a peripheral circuit configured to perform a sensing operation of sensing selected memory cells coupled to a selected word line selected from among the plurality of word lines; and
   control logic configured to control the peripheral circuit to apply a turn-on voltage to a block word line coupled to the selected word line when the sensing operation is terminated and when potentials of the plurality of word lines are increased due to a recovery operation for channels of the plurality of memory cells after the plurality of word lines have been discharged.

2. The memory device according to claim 1 further including a transistor coupled to the block word line, wherein the turn-on voltage is a voltage for turning on the transistor.

3. The memory device according to claim 1, wherein the turn-on voltage has a voltage level lower than a voltage level applied to the block word line during the sensing operation.

4. The memory device according to claim 1, wherein the control logic is configured to control the peripheral circuit to, during an idle state after the sensing operation has been terminated, apply the turn-on voltage to the block word line for a reference time interval.

5. The memory device according to claim 4, wherein the reference time interval is included in a time period corresponding to the idle state.

6. The memory device according to claim 1, wherein the control logic is configured to control the peripheral circuit to, when the turn-on voltage is applied to the block word line and the potentials of the plurality of word lines are then discharged, perform a subsequent sensing operation.

7. The memory device according to claim 6, wherein the control logic is configured to control the peripheral circuit to, during an idle state after the subsequent sensing operation has been terminated, apply the turn-on voltage to a block word line coupled to a word line, among the plurality of word lines, on which the subsequent sensing operation was performed.

8. A memory device, comprising:
   a memory cell array coupled to a plurality of word lines, wherein each word line is coupled to a plurality of memory cells;
   a peripheral circuit configured to perform a sensing operation of sensing selected memory cells coupled to a selected word line selected from among the plurality of word lines;
   an idle state sensor configured to determine whether the memory device is in an idle state in which no operation is being performed on the memory cell array and to generate status information;
   a voltage controller configured to generate voltage information used to set a voltage level to apply to a block word line coupled to the selected word line; and
   an operation signal generator configured to, when the sensing operation is terminated and when potentials of the plurality of word lines are increased due to a recovery operation for channels of the plurality of memory cells after the plurality of word lines have been discharged, generate an operation signal instructing a turn-on voltage to be applied to the block word line based on the status information and the voltage information.

9. The memory device according to claim 8, wherein the idle state sensor is configured to determine whether the memory device is in the idle state based on a ready/busy signal or an internal signal and to generate the status information indicating whether the memory device is in the idle state.

10. The memory device according to claim 8, wherein the voltage controller is configured to generate the voltage information when a recovery operation completion signal indicating that the recovery operation has been completed is received.

11. The memory device according to claim 8, wherein the voltage controller is configured to generate the voltage information to include information about a voltage level lower than a voltage level applied to the block word line during the sensing operation.

12. The memory device according to claim 8, wherein the operation signal generator is configured to, when the voltage information is received from the voltage controller and when the status information indicates the idle state, output the operation signal instructing the turn-on voltage to be applied to the block word line for a reference time interval in the idle state after the sensing operation has been terminated.

13. The memory device according to claim 12, wherein the reference time interval is included in a time period corresponding to the idle state.

14. A method of operating a memory device, the memory device including a memory cell array coupled to a plurality of word lines, wherein each word line is coupled to a plurality of memory cells, the method comprising:
performing a sensing operation of sensing selected memory cells coupled to a selected word line selected from among the plurality of word lines;
discharging the plurality of word lines after the sensing operation has been performed;
performing a recovery operation on channels of the plurality of memory cells;
determining whether the memory device is in an idle state during which no operation is being performed on the plurality of memory cells after the recovery operation has been performed; and
applying a turn-on voltage to a block word line coupled to the selected word line in the idle state.

15. The method according to claim 14, wherein applying the turn-on voltage comprises applying the turn-on voltage to a transistor coupled to the block word line.

16. The method according to claim 14, wherein applying the turn-on voltage comprises applying a voltage, to the block word line in the idle state, having a voltage level lower than a voltage level applied to the block word line during the sensing operation.

17. The method according to claim 14, wherein applying the turn-on voltage to the block word line comprises applying the turn-on voltage to the block word line for a reference time interval in the idle state.

18. The method according to claim 17, wherein the reference time interval is included in a time period corresponding to the idle state.

19. The method according to claim 14 further comprising performing a subsequent sensing operation after potentials of the plurality of word lines are discharged by applying the turn-on voltage to the block word line.

20. The method according to claim 19 further comprising applying, in an idle state after the subsequent sensing operation has been terminated, the turn-on voltage to a block word line coupled to a word line, among the plurality of word lines, on which the subsequent sensing operation was performed.

* * * * *